(12) United States Patent
Roesner et al.

(10) Patent No.: US 7,838,925 B2
(45) Date of Patent: Nov. 23, 2010

(54) INTEGRATED CIRCUIT INCLUDING A VERTICAL TRANSISTOR AND METHOD

(75) Inventors: Wolfgang Roesner, Ottobrunn (DE); Franz Hofmann, Munich (DE)

(73) Assignee: Qimonda AG, Munich (DE)

(*) Notice: Subject to any disclaimer, the term of this patent is extended or adjusted under 35 U.S.C. 154(b) by 41 days.

(21) Appl. No.: 12/173,524

(22) Filed: Jul. 15, 2008

(65) Prior Publication Data
US 2010/0013005 A1   Jan. 21, 2010

(51) Int. Cl.
    *H01L 29/732* (2006.01)
(52) U.S. Cl. .................... 257/328; 257/E29.262; 438/268
(58) Field of Classification Search ............. 257/213, 257/288, 327, 328, E29.262; 438/268, 270
    See application file for complete search history.

(56) References Cited

U.S. PATENT DOCUMENTS

| | | | |
|---|---|---|---|
| 5,519,236 A * | 5/1996 | Ozaki | 257/302 |
| 6,437,388 B1 * | 8/2002 | Radens et al. | 257/301 |
| 6,440,801 B1 | 8/2002 | Furukawa et al. | |
| 6,667,504 B1 | 12/2003 | Beintner et al. | |
| 6,822,281 B2 * | 11/2004 | Voigt et al. | 257/301 |
| 6,946,345 B2 | 9/2005 | Beintner et al. | |
| 7,135,731 B2 | 11/2006 | Hsiao et al. | |
| 7,355,230 B2 | 4/2008 | Thies et al. | |
| 2004/0046200 A1 * | 3/2004 | Wu | 257/301 |
| 2004/0129965 A1 * | 7/2004 | Chen | 257/301 |
| 2005/0037561 A1 * | 2/2005 | Wang et al. | 438/238 |
| 2007/0235833 A1 * | 10/2007 | Cheng et al. | 257/506 |

\* cited by examiner

*Primary Examiner*—Matthew S Smith
*Assistant Examiner*—Michele Fan
(74) *Attorney, Agent, or Firm*—Dicke, Billig & Czaja, PLLC

(57) ABSTRACT

An integrated circuit including a vertical transistor and method of manufacturing. In one embodiment a vertical transistor is formed in a pillar of a semiconductor substrate. A buried conductive line is separated from the semiconductor substrate by a first insulating layer in a first portion and is electrically coupled to a buried source/drain region of the vertical transistor through a contact structure. A second insulating layer is arranged above and adjacent to the contact structure. At least one of the first and second insulating layers includes a dopant. A doped region is formed in the semiconductor substrate at an interface to the at least one insulating layer. The doped region has a dopant concentration higher than a substrate dopant concentration.

15 Claims, 12 Drawing Sheets

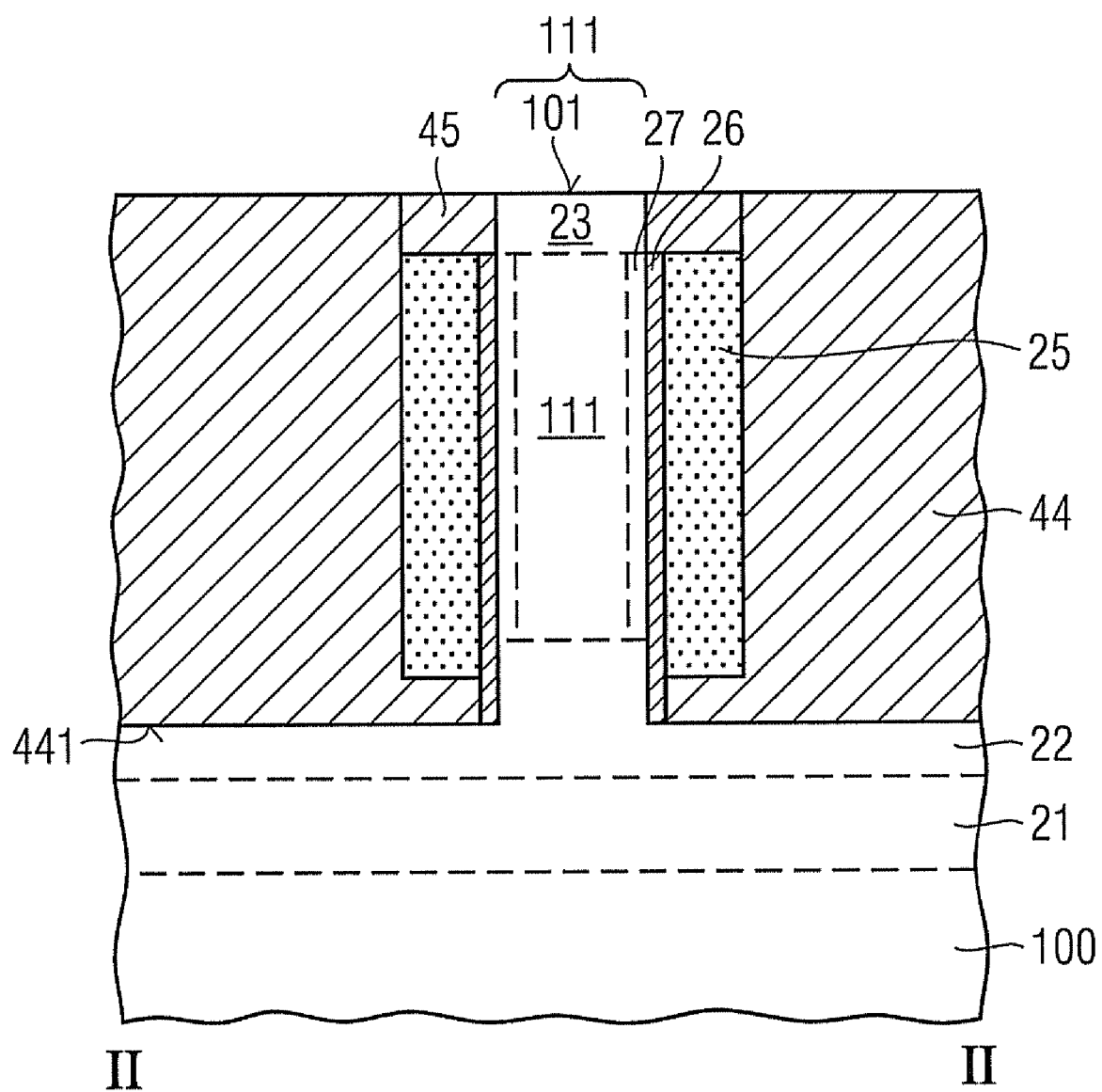

INTEGRATED CIRCUIT INCLUDING A VERTICAL TRANSISTOR AND METHOD

BACKGROUND

Vertical transistors and buried conductive lines facilitate dense and compact arrangements of logic circuits and memory cells. A vertical transistor includes a buried source/drain region that is connected to a buried conductive. A gate electrode, which is configured to control a current flow through the vertical transistor, is disposed along a body region between the buried source/drain region and a top source/drain region that may be formed at or near a substrate surface. The gate electrode controls the formation of an inversion layer of minority charge carriers (conductive channel) in the body region in dependence on a voltage supplied to the gate electrode. In the conductive channel a current flows between the two source/drain regions. The body region of a conventional vertical transistor is connected to a bulk portion of the substrate in which it is formed in order to avoid charge carrier accumulation in the body region and floating body effects resulting thereof.

The amount of a capacitive coupling between the gate electrode and the buried conductive structure on the one hand and the resistance of the body region in the transistor on-state on the other hand contribute to the transistor characteristics. A need exists for vertical transistors with enhanced transistor characteristics.

SUMMARY

An integrated circuit as described hereinafter includes a vertical transistor formed in a pillar of a semiconductor substrate. A buried conductive line is separated from the semiconductor substrate by a first insulating layer in a first portion and is electrically coupled to a buried source/drain region of the vertical transistor through a contact structure. A second insulating layer is arranged above and adjacent to the contact structure. At least one of the first and second insulating layers includes a dopant. A doped region is formed in the semiconductor substrate at an interface to the at least one insulating layer. The doped region has a dopant concentration higher than a substrate dopant concentration and may extend to a substantially uniform depth from the interface into the semiconductor substrate.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2C illustrates a cross-section along intersection line II-II of FIG. 1 through a portion of an integrated circuit with vertical transistors having connected buried source/drain regions according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
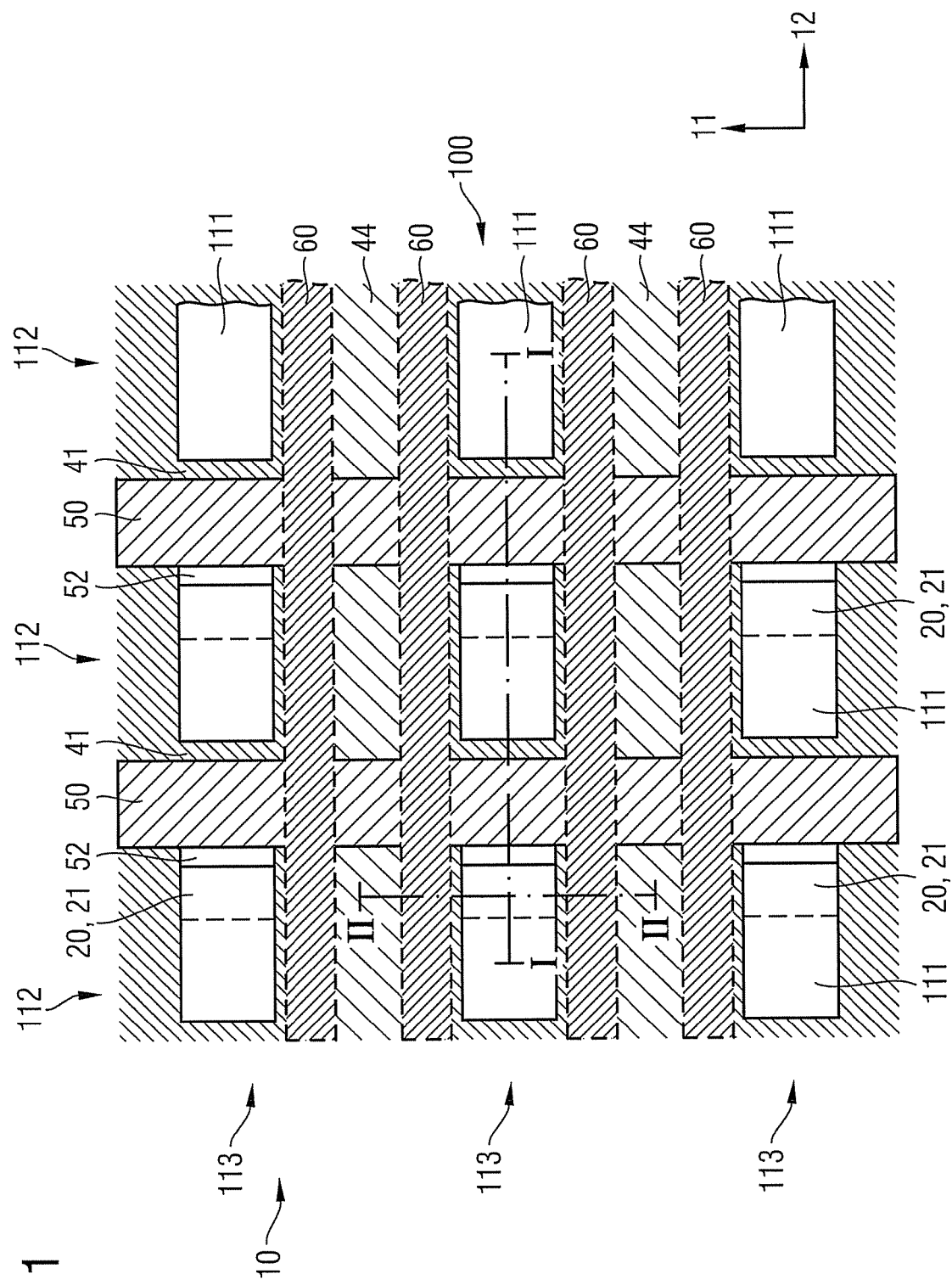
FIG. 1 illustrates a schematic planar cross-sectional view of a portion of an integrated circuit with vertical transistors formed in pillars and including channel connection regions or body connection regions in accordance with embodiments as illustrated in the following figures.

FIG. 1 illustrates a schematic planar cross-sectional view of an integrated circuit 10, which may be or may include a memory device, for example, a DRAM (dynamic random access memory), PCRAM (phase change random access memory), FBRAM (floating body random access memory), FeRAM (ferro-electric random access memory), MRAM (magnetic random access memory), or a EEPROM (electrically erasable programmable ROM). From a substrate 100, pillars 111 are formed that may be arranged in a regular matrix. The planar cross-section of the pillars 111 may be, for instance, a polygon or a rectangle, for example, a square, with or without rounded corners, a circle, an ellipse or an oval. The substrate 100 may be any semiconductor-based workpiece with a semiconductor surface, such as a silicon wafer, a silicon-on-insulator (SOI) wafer, a silicon-on-sapphire (SOS) wafer, or doped and undoped semiconductor structures or epitaxial layers of a semiconductor material supported by a base semiconductor or insulator foundation. The semiconductor may be, for example, silicon, silicon-germanium, germanium, or gallium arsenide. The substrate 100 may include further structures that have previously been fabricated.

Each pillar 111 forms a semiconductor body of a vertical transistor 20, which may be, for example, an access transistor for a storage element, a memory cell or a part of a logic, sense or driver circuit. A bulk substrate portion below the pillars 111 is of a first conductivity type. Each pillar 111 includes a buried first doped region, which may be effective as a first source/drain region 21 of the vertical transistor 20. The first source/drain region 21 is of a second conductivity type opposite to the first conductivity type. According to one embodiment, the first conductivity type is the p-type and the second conductivity type is the n-type.

Buried first conductive lines, which may be configured as bit lines 50, run between neighboring columns 112 of pillars 111 along a first direction 11. The dotted lines refer to buried second conductive lines that are arranged above the illustrated cross-sectional plane and that may run in pairs between neighboring rows 113 of pillars 111 above the bit lines 50 and along a second direction 12, which intersects the first direction 11, for example, perpendicularly. The buried second conductive lines may be configured as word lines 60, wherein portions of them are effective as gate electrodes of adjacent vertical transistors 20. According to the illustrated embodiment, two individual word lines 60 arranged at opposing sides of the same pillar 111 are configured to be held at the same potential at the same time and are effective as a gate electrode of the vertical transistor 20 associated to the pillar 111 in-between. According to one embodiment, one single word line 60 is arranged between neighboring rows 113 of pillars 111, respectively.

Between neighboring rows 113 of pillars 111, a fourth insulating layer 44 may be disposed between and below the word lines 60 to insulate neighboring word lines 60 against each other and to space the word lines 60 from both the bit lines 50 and a bulk substrate portion below the word lines 60.

A buried contact structure which is effective, for example, as a bit line contact 52, couples electrically the first source/drain region 21 to an associated bit line 50. According to one embodiment, the bit line contact 52 adjoins directly to the first source/drain region 21. In accordance with one or more embodiments, a low resistance interface layer or a coupling structure may be arranged between the first source/drain region 21 and the bit line contact 52. A portion of a first insulating layer 41 is disposed between the bit line 50 and the neighboring pillar 111 which faces the bit line contact 52 on the opposite side of the bit line 50. The material of the first insulating layer 41 may be silicon oxide, for example, silicon dioxide, silicon nitride, or siliconoxynitride and may have portions which include a dopant corresponding to the conductivity type of the bulk substrate portion, for example, boron for a p-type bulk substrate portion. The cross-section of FIG. 1 runs parallel to a main surface 101 of the substrate 100, intersects the bit line contacts 52 and may correspond to intersection line A-A illustrated in FIG. 2A.

Figure 2A:
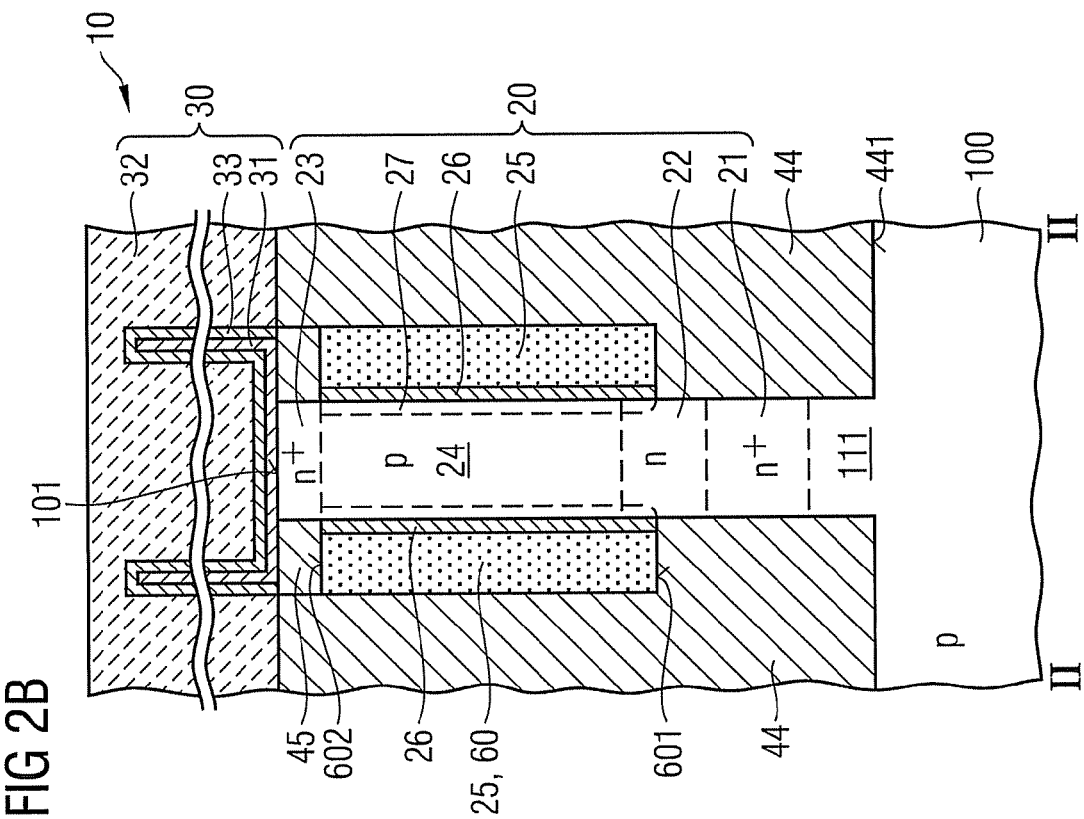
FIG. 2A illustrates a cross-section through a portion of an integrated circuit corresponding to intersection line I-I of FIG. 1 and refers to vertical transistors with a channel connection region in accordance with one embodiment.

FIG. 2A may correspond to a cross-sectional view through a portion of the substrate 100 of the integrated circuit 10 of FIG. 1 along the intersection line I-I and refers to one embodiment of a vertical transistor with a channel connection region. The intersection line I-I runs along the second direction 12 as illustrated in FIG. 1 and intersects pillars 111 and bit lines 50 in alternating order.

The illustrated embodiment refers to memory cells with vertical transistors, which are effective as access transistors for storage elements, for example, for capacitors 30. The capacitors 30 may be stacked capacitors formed above the main surface 101, wherein the main surface 101 is that surface of the substrate 100 which is exposed to pattern forming lithography techniques and that surface, on which the majority of functional electronic circuits is formed. Each capacitor 30 includes a capacitor dielectric 33 disposed between a first and a second capacitor electrode 31, 32. The first capacitor electrode 31 is electrically coupled to a second source/drain region 23 of the associated vertical transistor 20 and adjoins the second source/drain region 23 directly or via a low-resistance interface layer or a coupling structure, for example, a metal or a polysilicon plug. According to other embodiments referring to memory cells based on a charge storage effect in a floating transistor body, the "storage element" may be integrated in the access transistor.

Along the cross-sectional line I-I the pillars have a first width w11. The second source/drain region 23 is formed as a doped region of the second conductivity type in an upper portion of the respective pillar 111 and adjoins to the main surface 101. The second source/drain region 23 may extend over the complete planar cross-section of the pillar 111 as illustrated in FIG. 2A or over a portion thereof up to a width which is smaller than the first width w11. A body region 24 of the first conductivity type may be formed in each pillar 111 adjacent to the second source/drain region 23. The body region 24 may adjoin to the main surface 101 in embodiments with the second source/drain regions 23 extending over a portion of the planar cross-section of the pillars 111.

The buried first source/drain region 21 may be formed, for example, by dopant outdiffusion from the bit line contact 52 and extends from a first pillar side wall 102 oriented to the associated bit line 50 into the pillar 111 up to a second width w21 which may be smaller than the first width w11 in order to allow charge carriers pass from the body region 24 to a bulk substrate portion below the first source/drain regions 21 and to avoid floating body effects. The first width w11 may be, for example, about 60 nanometers or less and the second width w21 may be less than two third of the first width w11. According to other embodiments, the first source/drain region 21 extends over the whole planar cross-section of the pillar 111 such that the body region 24 may float and the transistor 20 forms a floating body memory cell.

The bit lines 50 are arranged in bit line trenches 51 introduced into the substrate 100 from the main surface 101, wherein an upper bit line edge 501, that is an upper surface of the bit lines 50, is situated beneath the main surface 101. The first insulating layer 41 lines portions of the bit line trenches 51, may wrap around three sides of the bit lines 50 and insulates electrically the bit lines 50 versus neighboring portions of the substrate 100. The bit line contact 52 replaces a portion of the first insulating layer 41 on an active side of the bit line 50. An upper surface 521 of the bit line contact 52 may be approximately flush with the upper bit line edge 501 or may be disposed beneath the upper bit line edge 501. The bit line contact 52 may extend between the bit line 50 and the adjoining first source/drain region 21 in the associated pillar 111 and connects them electrically at low ohmic resistance. The material of the bit line contact 52 is, for example, a metal or a metal compound and/or a material, for example, polysilicon, that includes a dopant of the second conductivity type, for example, phosphorus or arsenic.

A further doped region of the second conductivity type is effective as a doped channel connection region 22 that may be formed within the pillar 111 adjacent to the body region 24 and adjacent to and/or overlapping with the first source/drain region 21. The channel connection region 22 may extend above the bit line contact 52 along the first pillar side wall 102. The net dopant concentration of the channel connection region 22 decreases with increasing distance from the first pillar side wall 102. At least in a central portion of the channel connection region 22, the dopant equiconcentration lines are approximately parallel to the first pillar side wall 102. A concentration gradient indicating the normal on the equiconcentration lines is approximately perpendicular to the first pillar side wall 102 in the central portion. The central portion is situated in the pillar 111 above the upper bit line edge 501 of the bit line 50. Along a portion of the first pillar side wall 102, the maximum dopant concentration in the central portion is approximately constant. The maximum dopant concentration in the channel connection region 22 may be smaller than the maximum dopant concentration in the first source/drain region 21, for example, equal to or less than half thereof. The total dopant dose in the channel connection region 22 may be smaller than the total dopant dose in the first source/drain region 21. The channel connection region 22 extends from the first pillar side wall 102 up to a third width w22 into the pillar 111, wherein the third width w22 may be smaller than the second width w21, for example, half of the second width w21.

A second insulating layer 42 may be disposed above the bit line 50, for example, directly on the bit line 50 and directly on the bit line contact 52. The second insulating layer 42 may be, for example, a silicon oxide, silicon dioxide, silicon nitride, or silicon oxynitride layer and may include dopants of the second conductivity type. According to other embodiments, the first or the second insulating layer 41, 42 or both may be undoped and/or do not include dopants capable of diffusing out to a more than a negligible amount at a thermal exposure the substrate 100 is subjected to in course of further fabrication processes. The second insulating layer 42 may directly adjoin the first pillar side wall 102. A portion of the first insulating layer 41 may be disposed between the second insulating layer 42 and a side wall of a neighboring pillar 111 which is arranged at a passive side of the bit line 50 which is opposite to the active side with the bit line contact 52. At the passive side, an upper edge of the first insulating layer 41 may be approximately flush with an upper edge of the second insulating layer 42 as illustrated, or may have a larger distance to the main surface 101 than that of the second insulating layer 42, or may be approximately flush with the upper bit line edge 501 or may extend along the complete pillar side wall on the passive side of the bit line trench 51.

A third insulating layer 43 may be formed above the second insulating layer 42 and may fill the bit line trenches 51 up to the main surface 101. According to embodiments based on a sacrificial bit line trench fill, the second insulating layer 42 may be omitted and the third insulating layer 43 may extend between the main surface 101 and the bit line 50 in lieu thereof.

The material of the first and the second capacitor electrodes 31, 32 and the bit lines 50 may be a doped semiconductor material, a metal-semiconductor compound, for instance a silicide, a metal, a noble metal or a metal alloy, for example, polysilicon, Co, Ni, Ti, Ta, W, NiPt, TiN, TaN, TaSiN, Ru, WN, HfN, CoSi, TiSi, NiSi, NiPtSi, $WSi_x$, and TaSi or combinations thereof.

The material of the capacitor dielectric 33 may be a silicon oxide $Si_xO_y$, for example, silicon dioxide $SiO_2$, silicon nitride $Si_xN_y$, siliconoxynitride $SiO_xN_y$, a high-k dielectric having a dielectric constant greater than 3.9, for example, $HfO_2$, HfSiO (hafniumsilicate), $ZrO_2$, $Al_2O_3$, HfAlO, or TaO. The capacitor dielectric 33 may be a multilayer system including two or more layers of different materials.

The material of the first, second, third and fourth insulating layers 41, 42, 43 and 44 may be a silicon oxide $Si_xO_y$, for example, silicon dioxide $SiO_2$, silicon nitride $Si_xN_y$, siliconoxynitride $SiO_xN_y$, fluorinated silicate glass (FSG), or borophosphorous silicate glass (BPSG), for instance. The first and the second insulating layers 41, 42 may include a dopant, for example, boron, phosphorus or arsenic as described above, whereas the third and the fourth insulating layers 43, 44 may be undoped.

Figure 2B:
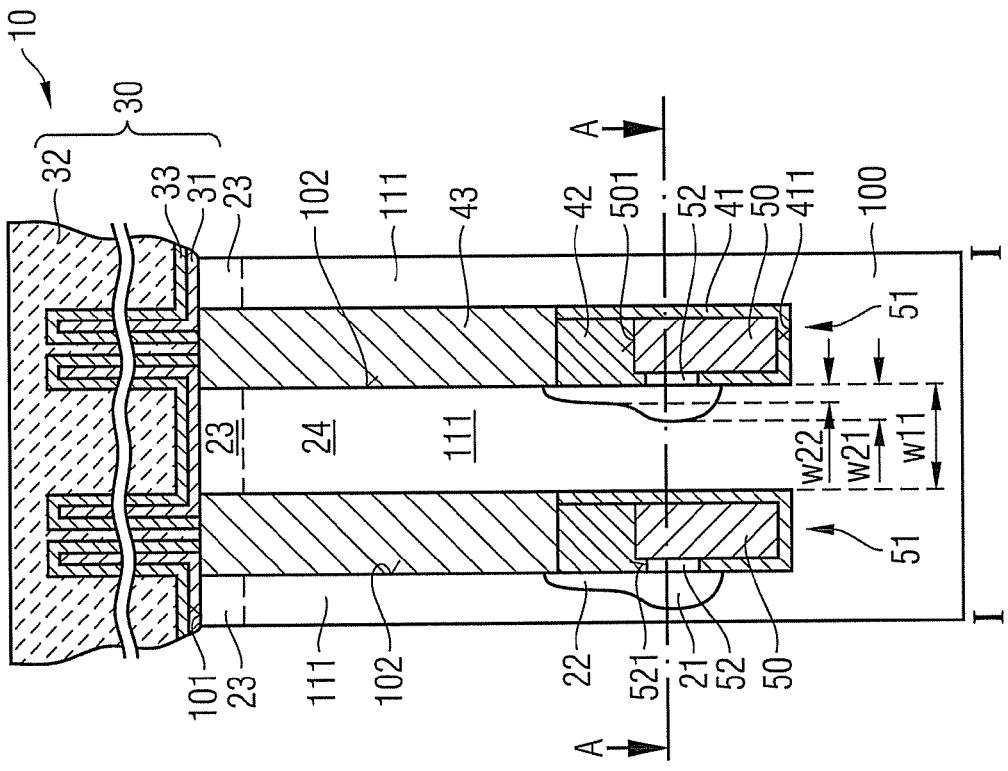
FIG. 2B illustrates a cross-section along intersection line II-II of FIG. 1 through a portion of an integrated circuit with vertical transistors having isolated buried source/drain regions according to one embodiment.

FIG. 2B may correspond to a cross-sectional view of the integrated circuit 10 of FIG. 2A along intersection line II-II in FIG. 1 and refers to one embodiment with vertical transistors with doped channel connection regions 22 and separated first source/drain regions 21. The intersection line II-II intersects word lines 60 and pillars 111. The word lines 60 are arranged at opposing sides of an associated pillar 111 in-between to form a double sided gate electrode 25 of a vertical transistor 20, the semiconductor body of which is formed within the pillar 111. A gate dielectric 26 is disposed between the gate electrode 25 and the pillar 111. A body region 24 formed within the pillar 111 adjacent to the gate dielectric 26 extends between the channel connection region 22 and the second source/drain region 23. A voltage supplied to the gate electrode 25 may control the charge carrier distribution in the body region 24 such that a conductive channel 27 may be formed in the pillar 111 next to the gate dielectric 26. The channel connection region 22 overlaps both the channel 27 and the buried first source/drain region 21 and reduces the resistance between the source/drain regions 21, 23 in the on-state of the vertical transistor 20. A distance between the word line 60 and the bit line 50 may be increased such that a capacitive coupling between them may be reduced without deteriorating the on-state characteristics of the vertical transistor 20.

The fourth insulating layer 44 is arranged between rows of pillars 111 below and between the word lines 60 and may be formed in isolation trenches running perpendicular to the illustrated cross-sectional plane, such that each pillar 111 may be surrounded by two bit line trenches running parallel to the illustrated cross-sectional plane and two isolation trenches running in a direction intersecting the illustrated cross-sectional plane, for example, perpendicularly. Portions of the fourth insulating layer 44 extend between a lower word line edge 601 and a portion of the substrate 100 below the isolation trenches. The word lines 60 may be completely buried, wherein an upper word line edge 602 is situated below the main surface 101 and a fifth insulating layer 45 may be provided between the upper word line edge 602 and the main surface 101.

The lower word line edge 601 may be situated between the upper bit line edge 501 as illustrated in FIG. 2A and an upper edge of the channel connection region 22 as illustrated in FIG. 2A such that the word lines 60 overlap with the channel connection regions 22. A large distance between the upper bit line edge and the lower word line edge 601 results in a low capacitive coupling and a good electrical insulation between the bit lines 50 and the word lines 60. Then, since the first source/drain region 21 may be formed by outdiffusion from the bit line contact 52, a high resistance gap may occur between the buried first source/drain region 21 and the body region 24, in which the charge carrier distribution is controlled via the potential applied to the gate electrode 25. The doped channel connection region 22 may close the high resistance gap and thus may provide a low resistance path between the body region 24 and the buried first source/drain region 21 in the conductive mode of the vertical transistor 20 such that the Drain-to-Source Resistance in the transistor On-state ($R_{D\text{-}Son}$) may be improved.

The first source/drain regions 21 may be formed completely within the respective pillar 111 such that portions of the fourth insulating layer 44 isolate the first source/drain regions 21 of individual ones of the vertical transistors 20 being coupled to the same bit line 50 from each other. A lower edge 441 of the fourth insulating layer 44 may be approximately flush with a lower edge 411 of the first insulating layer 41 as illustrated in FIG. 2A. According to one embodiment, the distance between the lower edge 441 of the fourth insulating layer 44 and the main surface 101 is larger or smaller than the distance between the lower edge 411 of the first insulating layer 41 and the main surface 101.

FIG. 2C corresponds to a cross-sectional view of another integrated circuit 10 according to FIG. 2A along intersection line II-II in FIG. 1 and refers to one embodiment of vertical transistors with a continuous first source/drain region 21. The distance between a lower edge 441 of the fourth insulating layer 44 and the main surface 101 is smaller than the distance between a lower edge 411 of the first insulating layer 41 as illustrated in FIG. 2A and the main surface 101 such that the first source/drain regions 21 of individual ones of the vertical transistors coupled to the same bit line 50 are connected to each other and form a continuous structure within the substrate 100. The isolation trenches may be shallower than the bit line trenches 51 as illustrated in FIG. 2A. The lower edge 441 of the fourth insulating layer 44 may have a distance to the main surface 101 that is smaller or larger than or equal to the distance between the main surface 101 and an upper junction of the first source/drain region 21 to further portions of the substrate 100.

Figure 3:
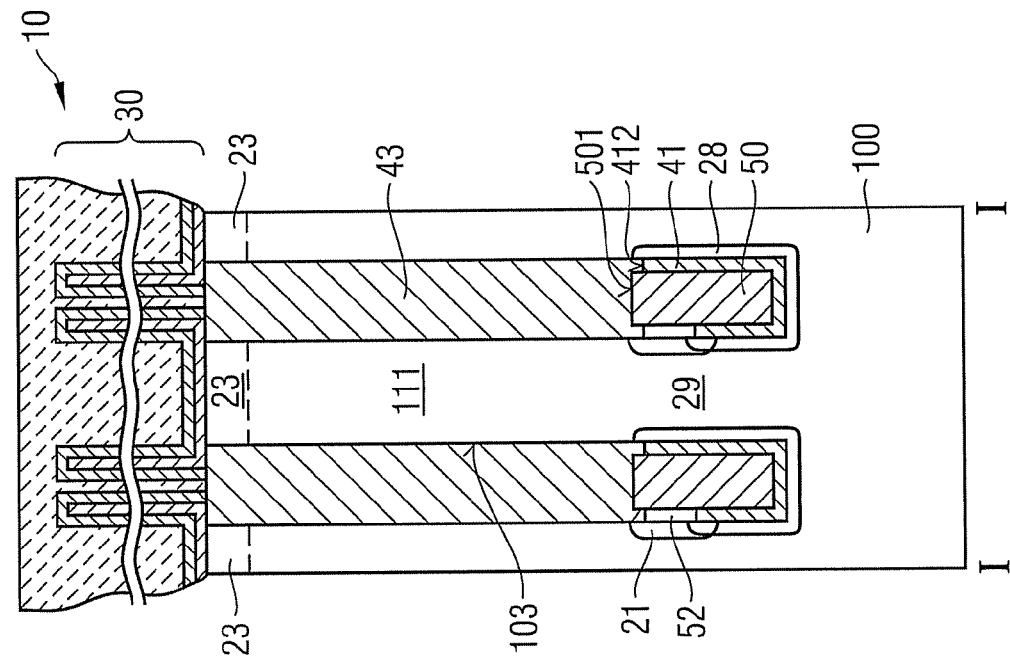
FIG. 3 illustrates a cross-section along intersection line I-I of FIG. 1 through a portion of an integrated circuit with vertical transistors having doped body connection regions extending over a complete pillar side wall according to one embodiment.

FIG. 3 refers to a cross-sectional view of another integrated circuit 10 as illustrated in FIG. 1 along intersection line I-I of FIG. 1. The integrated circuit 10 includes a buried bit line 50 formed in a bit line trench 51, a vertical transistor 20 and a storage capacitor 30 as described with respect to FIGS. 2A to 2C. The vertical transistor 20 includes a first and a second source/drain region 21, 23 and a body region 24 spacing the first and second source/drain regions 21, 23 which are arranged in a pillar 111 formed in a substrate 100. The first and the second source/drain regions 21, 23 have a second conductivity type oppositely to a first conductivity type of the body region 24 and further portions of the substrate 100. A bit line contact 52 electrically couples the first source/drain region 21 to the bit line 50.

A first insulating layer 41 may extend over a second pillar side wall 103 on a passive side of the pillar 111, wherein the passive side is opposite to an active side, on which the bit line contact 52 is formed. A portion of the first insulating layer 41 is arranged between the bit line 50 and the pillar 111 associated to the bit line 50 and between the bit line 50 and further portions of the substrate 100. At least a portion of the first insulating layer 41 may include dopants of the first conductivity type. A doped body connection region 28 of the first conductivity type and a net dopant concentration greater than that of the body region 24 is formed within the pillars 111 and within the further portions of the substrate 100 adjacent to the doped portion of the first insulating layer 41. The first insulating layer 41 may extend along the whole second pillar side wall 103 or a portion thereof.

In accordance with one embodiment, the first insulating layer 41 may include dopants of the first conductivity type in all portions, and the doped body connection region 28 extends along the second pillar side wall 103, below the bit line 50, and along a portion of a first pillar side wall 102 on the active side below the first source/drain region 21. According to another embodiment, the body connection region 28 may be formed along the second pillar side wall 103, for example, in a portion opposite to the first source/drain region 21, but not along the first pillar side wall 102. In each pillar 111, a spacer region 29 with the conductivity type and the dopant concentration of the body region 24 may remain between the body connection region 28 and the first source/drain region 21 such that no direct junction is formed between them. If the first source/drain region 21 has no direct junction to the body connection region 28, a junction leakage current from the first source/drain region 21 to further portions of the substrate 100 may be reduced.

Within the body connection region 28, the net dopant concentration decreases with increasing distance to the first insulating layer 41. At least in a central portion of the body connection region 28 along the second pillar side wall 103, the dopant equiconcentration lines are approximately parallel to the second pillar side wall 103 and a concentration gradient indicating the normal on the equiconcentration lines is approximately perpendicular to the second pillar side wall 103. Along a portion of the second pillar side wall 103, the maximum dopant concentration is approximately constant. The body connection region 28 provides a low-resistance path for electrically coupling the body region 24 within the pillar 111 to further portions of the substrate 100 below the buried first source/drain region 21. The increased net dopant concentration in the body connection region 28 may reduce the probability for a pinch-off of the body region 24 during operation of the integrated circuit. A third insulating layer 43 may fill the bit line trenches 51 between the bit lines 50 and a main surface 101 of the substrate 100.

Figure 4:
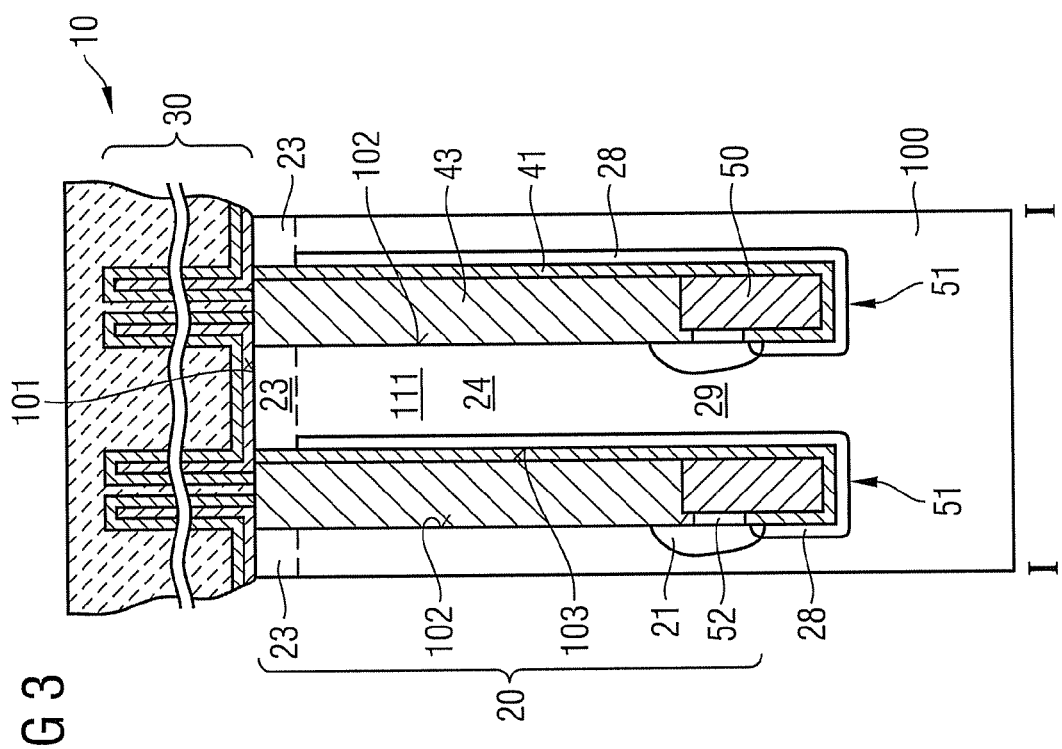
FIG. 4 illustrates a cross-section along intersection line I-I of FIG. 1 through a portion of an integrated circuit with vertical transistors having doped body connection regions formed in a lower pillar portion in accordance with one embodiments.

FIG. 4 refers to a cross-sectional view of another integrated circuit 10 as illustrated in FIG. 1 along intersection line I-I with vertical transistors having local body connection regions. The embodiment illustrated in FIG. 4 differs from that illustrated in FIG. 3 in that, with regard to the second pillar side wall 103 on the passive side, the first insulating layer 41 extends just along a lower portion thereof. An upper edge 412 of the first insulating layer 41 may be approximately flush with an upper bit line edge 501 of a bit line 50. An upper edge of the body connection region 28 may approximately correspond to the upper edge 412 of the first insulating layer 41.

Figure 5:
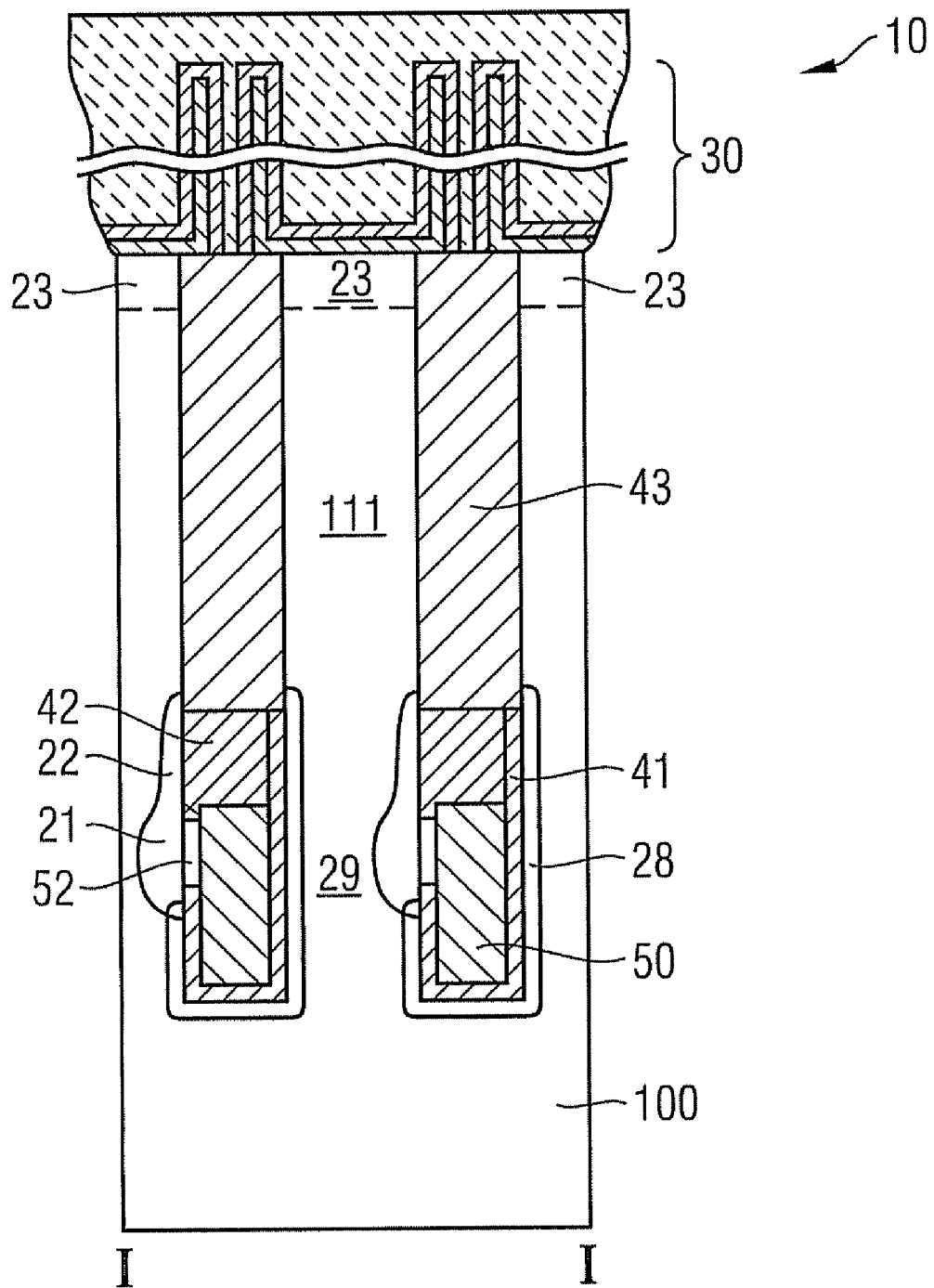
FIG. 5 illustrates a cross-section along intersection line I-I of FIG. 1 through a portion of an integrated circuit with vertical transistors having a channel connection region and a body connection region according to one embodiment.

FIG. 5 refers to a cross-sectional view of another integrated circuit 10 as illustrated in FIG. 1 along intersection line I-I with vertical transistors having local body connection regions as described with respect to FIG. 4 and doped channel connection regions, as described with respect to FIGS. 2A to 2C. The integrated circuit 10 includes a first, a second and a third insulating layer 41, 42, 43 as described with respect to FIG. 2A, wherein at least a portion of the first insulating layer 41 includes dopants of the first conductivity type.

Figure 6:
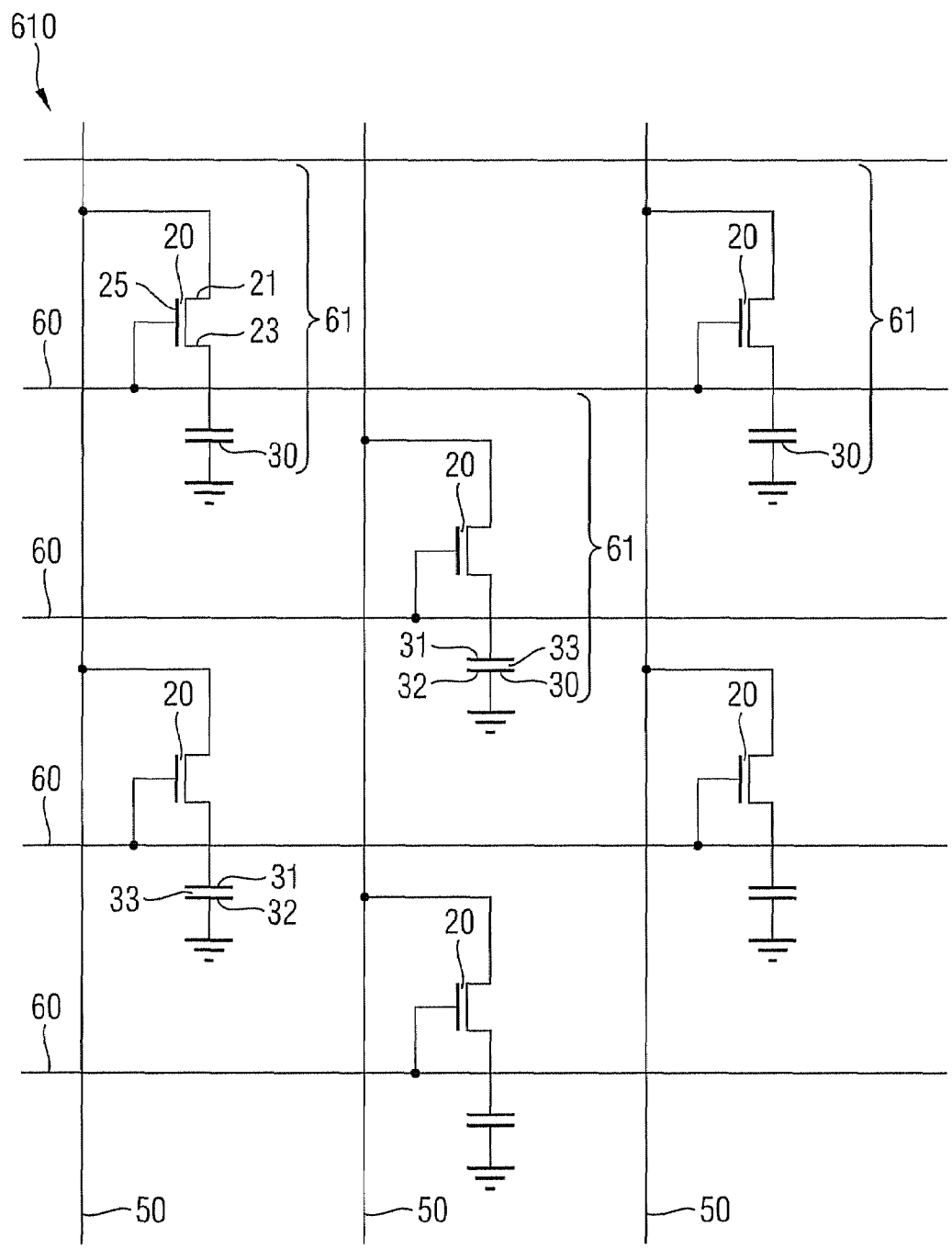
FIG. 6 illustrates a block circuit diagram of a memory cell array with buried conductive lines for illustrating a wiring scheme for memory cells in accordance with one embodiment.

FIG. 6 is a schematic circuit diagram of one embodiment of an integrated circuit including memory cells as described above. A memory cell array 610 includes a plurality of memory cells 61. Individual ones of the memory cells 61 may include an access transistor 20 and a storage element, for instance, a storage capacitor 30. First source/drain regions 21 of access transistors 20 associated to a transistor row may be electrically coupled to one of a plurality of bit lines 50. Gate electrodes 25 of access transistors 20 associated to a transistor column may be electrically coupled to one of a plurality of word lines 60. Second source/drain regions 23 of the access transistors 20 are electrically coupled to storage elements, for example, to first capacitor electrodes 31 of the associated storage capacitors 30. The memory cell array 610 may be a part of a memory device, like a DRAM, or an integrated circuit including a memory device, for example, an integrated circuit with embedded DRAM.

Figure 7:
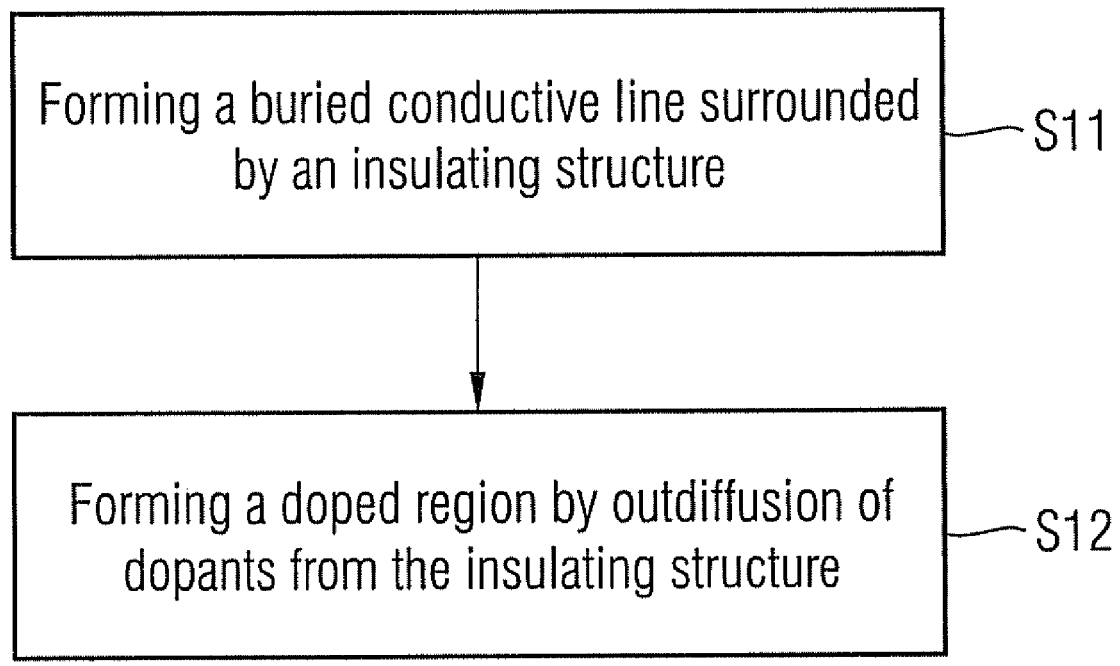
FIG. 7 is a flow chart illustrating a method of manufacturing an integrated circuit including a buried conductive line and a connection region in accordance with one embodiment.

FIG. 7 is a flow chart illustrating a method of manufacturing an integrated circuit with a buried conductive line and a buried doped region in accordance with one embodiment. A buried conductive line is formed, for instance in a line-shaped trench. An upper surface of the buried conductive line is situated below a main surface of a substrate, wherein an insulating structure is provided between portions of the buried conductive line and the substrate and above the buried conductive line. At least a portion of the insulating structure may be doped with dopants (S11). A doped region is formed within the substrate by outdiffusion of dopants from the portion of the insulating structure (S12).

Figure 8B:
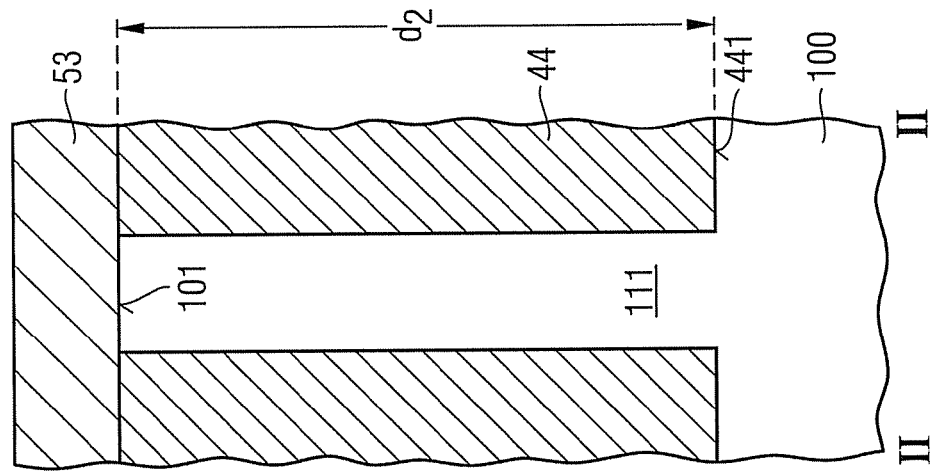
FIG. 8B illustrates a schematic cross-sectional view of the portion of the semiconductor substrate according to FIG. 8A along intersection line II-II of FIG. 1.
Figure 8A:
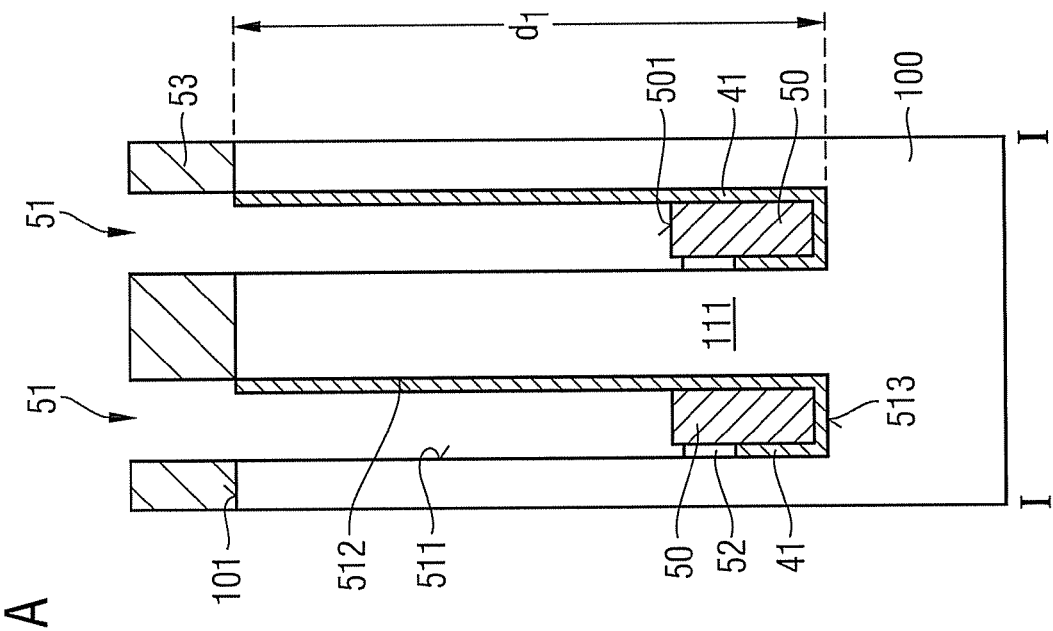
FIG. 8A illustrates a schematic cross-sectional view of a portion of a semiconductor substrate along intersection line I-I of FIG. 1 for illustrating a method of manufacturing an integrated circuit with vertical transistors according to one embodiment, after forming buried conductive lines.

FIG. 8A and the following Figures refer to cross-sectional illustrations of substrate portions along intersection lines I-I and II-II as illustrated in FIG. 1 and illustrate methods of manufacturing an integrated circuit with vertical transistors in accordance with further embodiments.

Referring to FIG. 8A, an anisotropic etch using an etch mask 53 with line-shaped openings and disposed on a main surface 101 of a semiconductor substrate 100 having a first conductivity type may define a plurality of bit line trenches 51 in a portion of the semiconductor substrate 100. The bit line trenches 51 may run along a first direction perpendicular to the intersectional line I-I. The bit line trenches 51 may have approximately vertical side walls 511, 512 or they may taper from a large width near the main surface 101 to a small width at the bottom of the bit line trenches 51, for instance such that the side walls 511, 512 are tilted at a taper angle of 5° or less with respect to the normal on the main surface 101, or they may taper from a large width near the bottom to a small width near the main surface 101. According to other embodiments, sections of the bit line trenches 51 may have different widths. The side walls 511, 512 may be straight, inwardly or outwardly bowed or waved. The width of the bit line trenches 51 and the taper angle may vary over the distance to the main surface 101.

A first insulating layer 41 may be formed at the side walls 511, 512 and at a bottom surface 513 of each bit line trench 51. The first insulating layer 41 may be deposited via chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or another deposition technique, or may be formed by other techniques, for instance via thermal oxidation. The first insulating layer 41 may be a conformal layer lining the bit line trenches 51 and covering the side walls 511, 512 and the bottom surface 513. The first insulating layer 41 may be formed completely undoped or in a manner such that at least a portion of the first insulating layer 41 includes dopants of the first conductivity type.

A buried conductive line, which may be effective as a bit line 50, is formed in individual ones of the bit line trenches 51 adjacent to the first insulating layer 41, for example, directly on the first insulating layer 41. The bit lines 50 may be deposited via CVD, HDP-CVD, ALD, MOCVD, PVD, JVD, or another deposition technique. An upper bit line edge 501 has a distance to the main surface 101 that is smaller than a first distance d1 between the bottom surface 513 of the bit line trenches 51 and the main surface 101.

A portion of the first insulating layer 41 may be removed, for instance by an etching process at an upper portion of the side wall 511. This local selectivity of the etching process may be accomplished, for example, by depositing a masking layer, for instance polysilicon, on the first insulating layer 41 and doping the masking layer at the upper portion of the side wall 511 using a tilted implantation of dopants. Since the doped portion of the masking layer may be removed selectively with respect to the undoped portion, for instance by a wet etch process, the first insulating layer 41 may be accessible for an etching process at a portion not covered by the masking layer. Thus, the first insulating layer 41 may be removed at least from the upper portion of the side wall 511, wherein the upper portion may extend between the main surface 101 and a lower edge, which distance to the main surface 101 is larger than the distance between the upper bit line edge 501 and the main surface 101 and smaller than or equal to the first distance d1 such that a gap is formed between the bit line 50 and the first side wall 511. A bit line contact 52 including dopants of a second conductivity type opposite to the first conductivity type is formed in the gap and adjacent to the first side wall 511 above the recessed first insulating layer 41. The bit line contact 52 may be formed by depositing a doped conductive material using CVD, HDP-CVD, ALD, MOCVD, PVD, JVD, or another deposition technique and removing a portion of the conductive material which is deposited on or above the bit lines 50.

As illustrated in FIG. 8B, which is a cross-sectional view corresponding to the intersection line II-II of FIG. 1, isolation trenches may be formed that run along a second direction intersecting the cross-sectional line II-II. A lower isolation trench edge 441 may have a second distance d2 to the main surface 101. The second distance d2 may be smaller or larger than or equal to the first distance d1. The isolation trenches may be filled with an insulating material, for instance a fourth insulating layer 44. The insulating material may fill the isolation trenches completely. The isolation trenches may be defined and filled before the bit line trenches 51 are etched as indicated by the etch mask 53 that is formed after the isolation trenches have been filled with the fourth insulating layer 44. The isolation trenches and the bit line trenches define pillars 111 of the substrate material in-between.

According to other embodiments, the bit line trenches 51 and the bit lines 50 may be formed before the isolation trenches and the fourth insulating layer 44. Each of the described processes may include a sequence of sub-processes and the chronology of the sub-processes may be altered. According to other embodiments, individual sub-processes may be performed simultaneously.

Figure 9B:
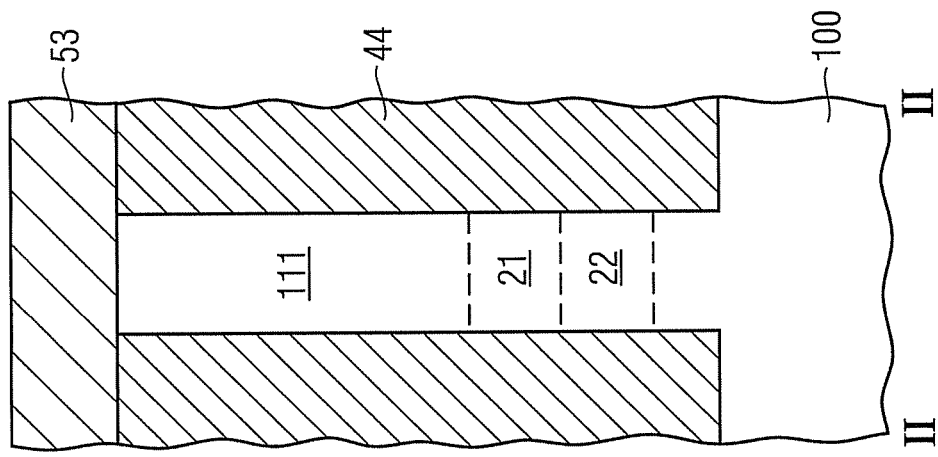
FIG. 9B illustrates a schematic cross-sectional view of the portion of the semiconductor substrate according to FIG. 9A along intersection line II-II of FIG. 1.
Figure 9A:
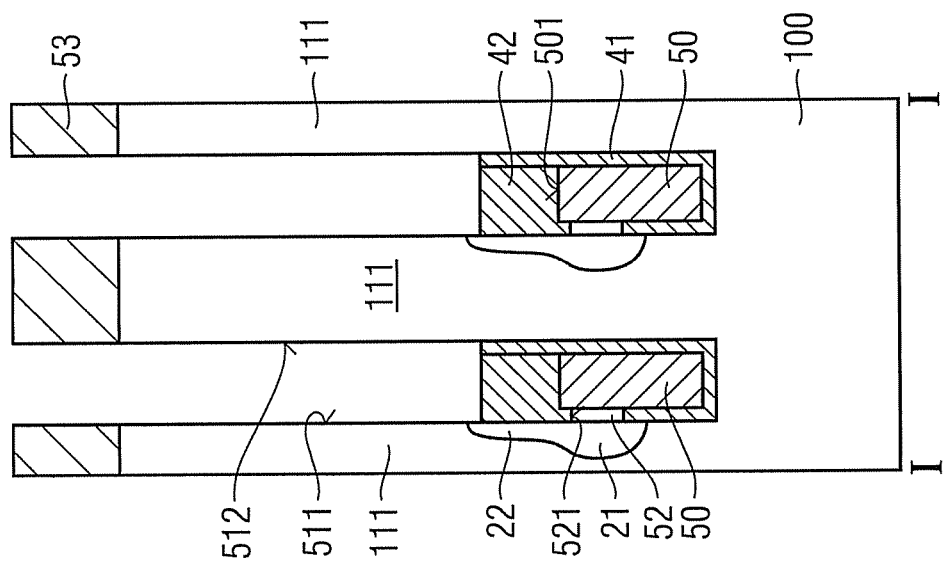
FIG. 9A illustrates a schematic cross-sectional view of the portion of the semiconductor substrate according to FIG. 8A for illustrating a method of manufacturing an integrated circuit in accordance with one embodiment, after forming a channel connection region.

Referring to FIG. 9A, a second insulating layer 42 including dopants of the second conductivity type may be formed adjacent to the upper surface 501 of the bit line 50 and adjacent to an upper surface 521 of the bit line contact 52. The second insulating layer 42 is formed adjacent to the first side wall 511, but does not adjoin the second side wall 512 that is oriented to the neighboring pillar 111. The second insulating layer 42 may be formed by depositing an insulating material via CVD, HDP-CVD, ALD, MOCVD, PVD, JVD, or another deposition technique. The insulating material is removed from upper portions of the bit line trenches 51, wherein first portions of the first insulating layer 41 may also be removed from the upper portions of the bit line trenches 51, and second portions of the first insulating layer 41 are left disposed between the second insulating layer 42 and the second side wall 512.

Through a subsequent thermal treatment, dopants from the bit line contact 52 and from the second insulating layer 42 diffuse into adjacent portions of the substrate 100 to form a first doped region which may be effective as a first source/drain region 21 and a doped channel connection region 22 as yet described with respect to FIG. 2A. The first source/drain region 21 and the channel connection region 22 may be formed simultaneously. According to another embodiment, the first source/drain region 21 may be formed through a first thermal treatment before the second insulating layer 42 is deposited and the channel connection region 22 is formed through a second thermal treatment. According to one embodiment illustrated in FIG. 9A, the first insulating layer 41 is undoped or includes dopants at a low concentration, for example, lower than the bulk doping of the substrate. The concentration may be lower than required to change the conductivity type of the substrate adjacent to the first insulating layer 41.

The thermal treatment for outdiffusion of dopants may be performed as an individual process, like an annealing process, or may be an integral part of another, subsequently performed process, for instance a deposition, reflow or etching process. Further processes, like completion of the fill of the bit line trenches 51 with an insulating material may be performed before the thermal treatment.

Referring to FIG. 9B, the channel connection region 21 is formed adjacent to the buried first source/drain region 22 in each pillar 111.

The vertical transistors may be completed by forming second source/drain regions, gate dielectric and gate electrodes. Storage elements may be provided to form a structure as illustrated in FIG. 2A. The second insulating layer 42, which includes dopants of the second conductivity type, may be removed after forming the doped channel connection region 22 and replaced with another, undoped insulating layer. According to a corresponding embodiment, the second insulating layer 42 is undoped.

Figure 10:
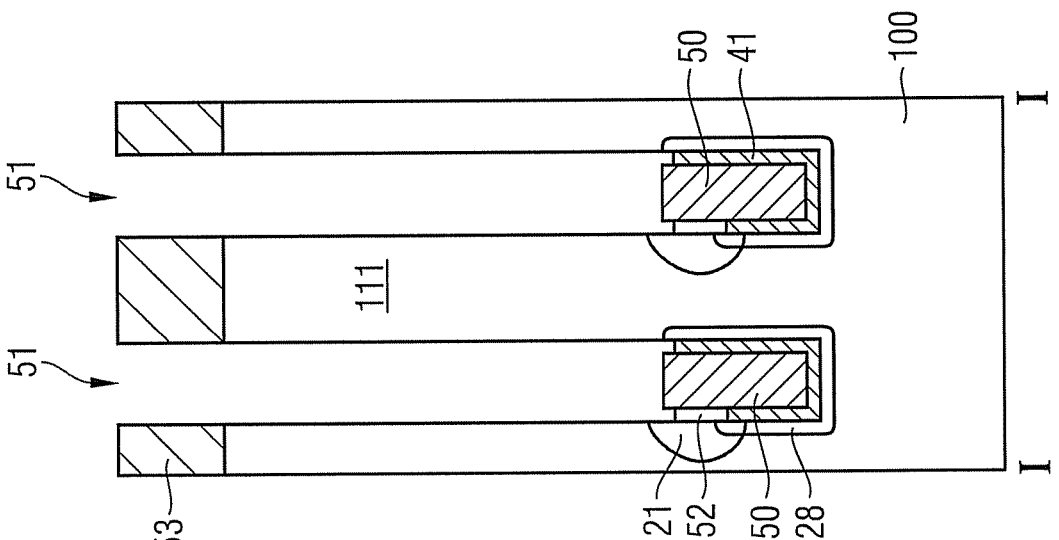
FIG. 10 illustrates a schematic cross-sectional view of the portion of the semiconductor substrate according to FIG. 8A for illustrating a method of manufacturing an integrated circuit with vertical transistors, after forming a body connection region extending over a complete pillar side wall.

According to one embodiment illustrated in FIG. 10, the first insulating layer 41 extends over the complete second side wall 512 and includes dopants of the first conductivity type over its whole extend. During a thermal treatment, dopants from the first insulating layer 41 and from the bit line contact 52 diffuse into adjacent portions of the substrate 100 to form a first doped region, for example, a source/drain region 21, and a body connection region 28 as yet described with respect to FIG. 3.

Figure 11:
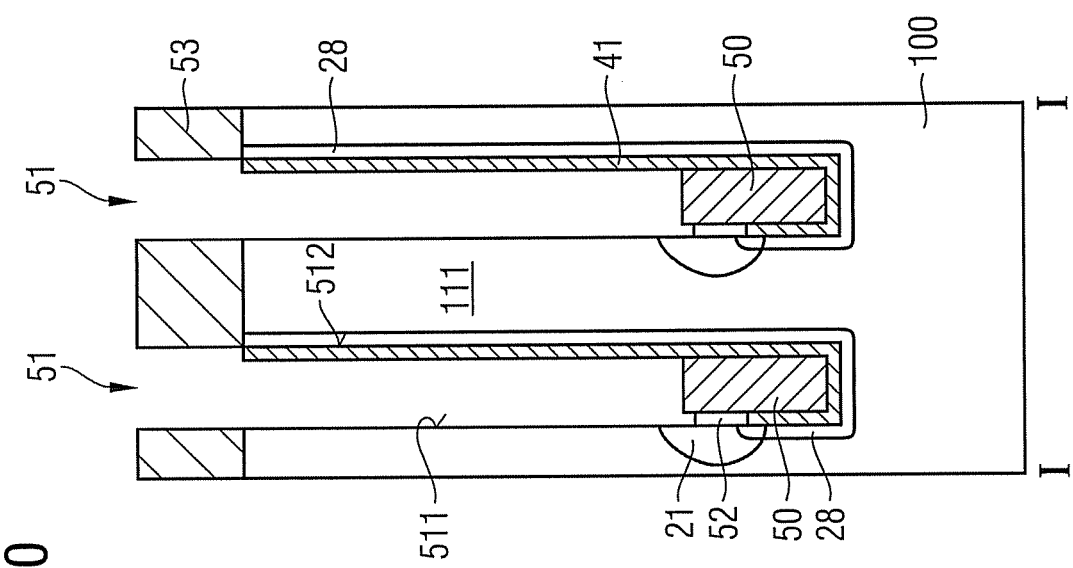
FIG. 11 illustrates a schematic cross-sectional view of the portion of the semiconductor substrate according to FIG. 8A for illustrating a method of manufacturing an integrated circuit with vertical transistors, after forming a body connection region extending over a lower pillar portion.

According to a further embodiment illustrated in FIG. 11, the first insulating layer 41 is formed adjacent to lower portions of the second side wall 512. The first insulating layer 41 includes dopants of the first conductivity type over its whole extend. In course of a thermal treatment, dopants from the first insulating layer 41 and from the bit line contact 52 diffuse into adjacent portions of the substrate 100 to form a first doped region 21 and a doped body connection region 28 as yet described with respect to FIG. 4. In accordance with other embodiments, a portion of the first insulating layer 41 facing the bit line contact 52 on the opposing side of the bit line 50 includes dopants of the first conductivity type.

Figure 12:
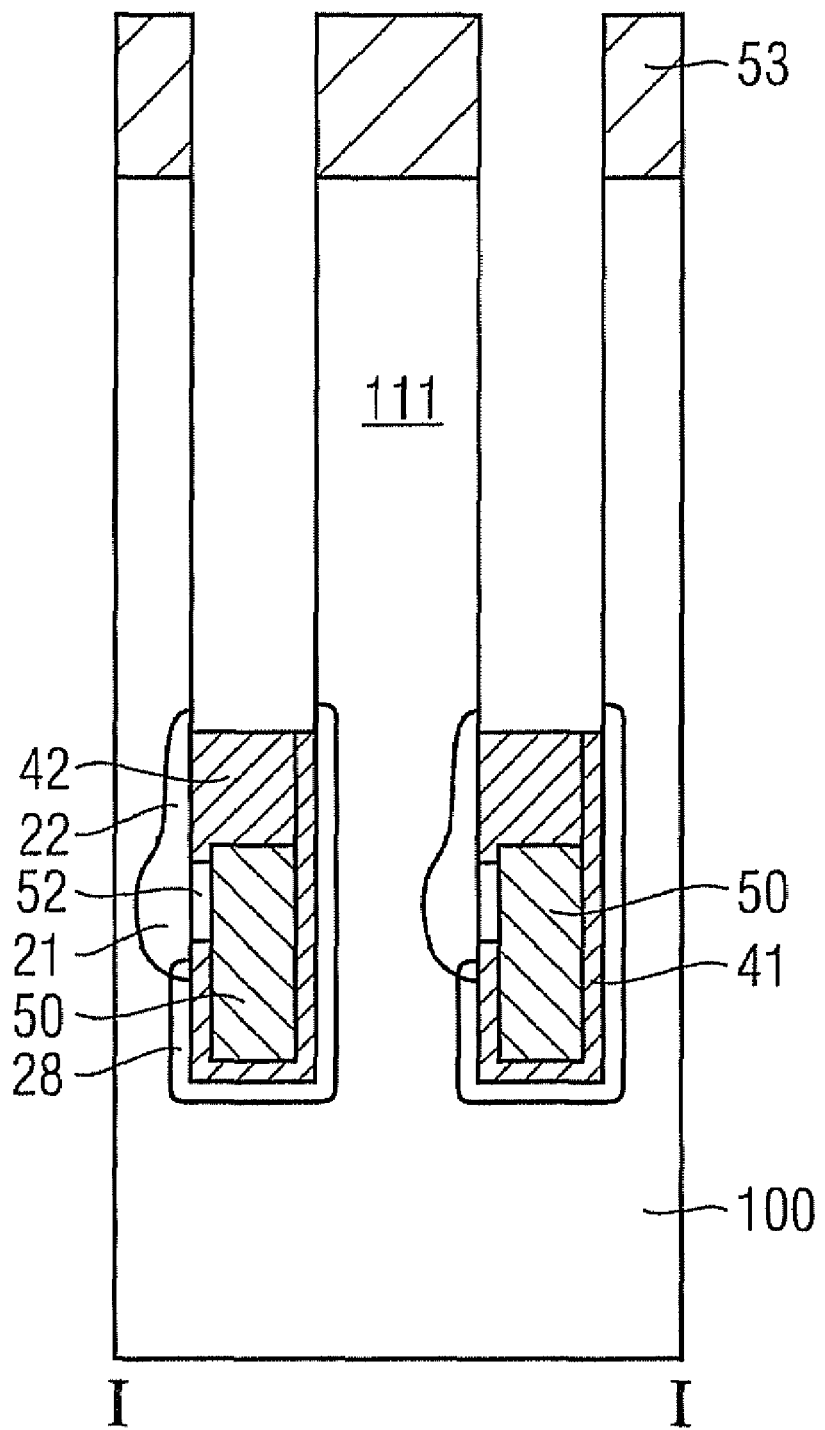
FIG. 12 illustrates a schematic cross-sectional view of the portion of the semiconductor substrate according to FIG. 8A for illustrating a method of manufacturing an integrated circuit with vertical transistors, after forming a channel connection region and a body connection region that extends over a lower pillar portion.

Referring to FIG. 12, in accordance with another embodiment, at least a portion of the first insulating layer 41 includes dopants of the first conductivity type and a second insulating layer 42 includes dopants of the second conductivity type. During a thermal treatment, dopants diffuse out from the first insulating layer 41, the second insulating layer 42 and the bit line contact 52 into adjacent portions of the substrate 100 and form a first source/drain region 21, a channel connection region 22 and a body connection region 28 as described above with respect to FIG. 5. The embodiments of the integrated circuit illustrated in FIGS. 2A to 5 and the embodiments of the method for manufacturing an integrated circuit described with respect to FIGS. 8A to 12 may be combined with each other.

Figure 13:
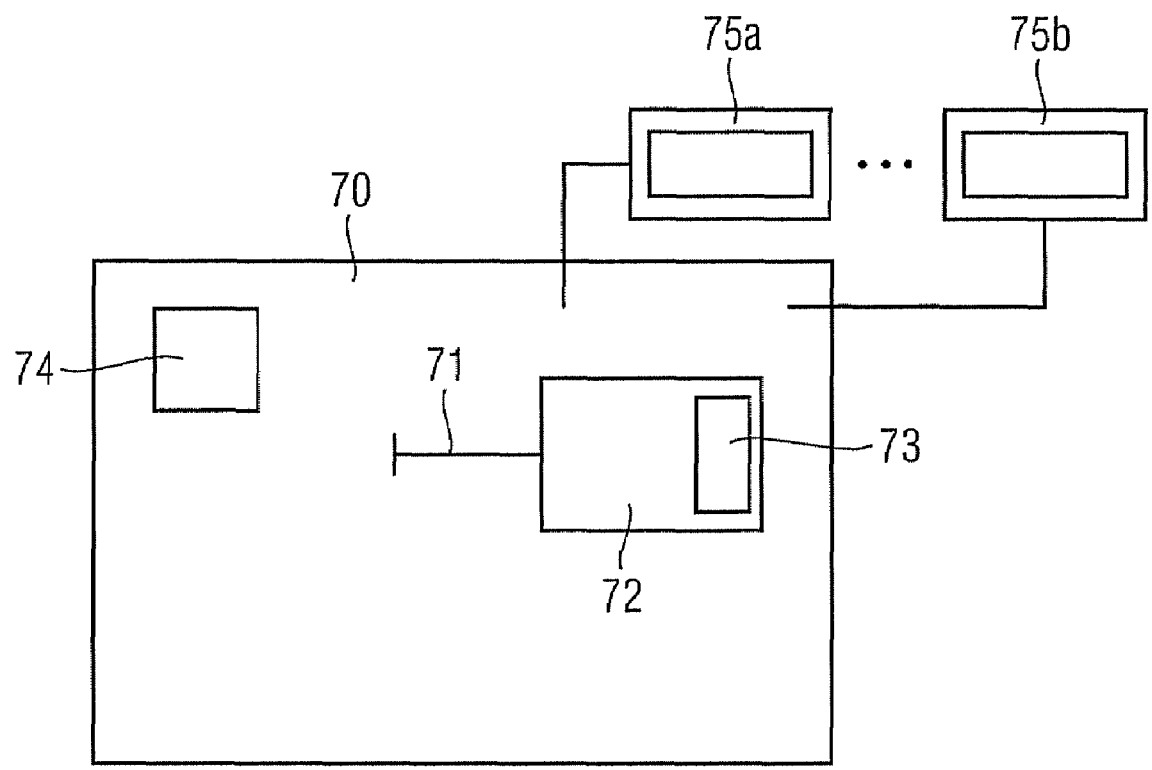
FIG. 13 illustrates schematically an electronic device including an integrated circuit according to one embodiment.

FIG. 13 schematically illustrates an electronic device 70 according to one embodiment. The electronic device 70 may have an interface 71 and a component 72 which is configured to be interfaced by the interface 71. The component 72 may include an integrated circuit 73 as described above. The component 72 may be connected in an arbitrary manner with the interface 71. For example, the component 72 may be externally placed and may be connected with the electronic device 70 via the interface 71. In other embodiments, the component 72 may be housed inside the electronic device 70. By way of example, the component 72 is removably placed into a slot which is connected with the interface 71. When the component 72 is inserted into the slot, the integrated circuit 73 is interfaced by the interface 71. The electronic device 70 may further include a processing device 74 for processing data. In addition, the electronic device 70 may further include one or more display devices 75a, 75b for displaying data. The electronic device 70 may further include components which are configured to implement a specific electronic system. Examples of the electronic system include a computer, for example, a personal computer, or a notebook, a server, a router, a game console, for example, a video game console, as a further example, a portable video game console, a graphics card, a personal digital assistant, a digital camera, a cell phone, an audio system such as any kind of music player or a video system. For example, the electronic device 70 may be a portable electronic device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a vertical transistor formed in a pillar of a semiconductor substrate, comprising:
   a buried first conductive line separated from the semiconductor substrate by a first insulating layer in a first portion and connected to a first source/drain region of the vertical transistor through a contact structure;
   a second insulating layer arranged above and adjacent to the contact structure; and
   a doped region formed in the semiconductor substrate,
   wherein at least one of the first and second insulating layers comprises a dopant, and the doped region is arranged at an interface to the at least one insulating layer, the doped region having a dopant concentration higher than a substrate dopant concentration.

2. The integrated circuit of claim 1, comprising wherein the doped region extends to a substantially uniform depth from the interface into the semiconductor substrate.

3. The integrated circuit of claim 1, comprising wherein the at least one insulating layer is the second insulating layer, and the dopant is of the same conductivity type as the first source/drain region, and the doped region forms a contiguous channel connection region with the first source/drain region.

4. The integrated circuit of claim 3, comprising wherein a total dopant dose in the channel connection region is smaller than a total dopant dose in the first source/drain region.

5. The integrated circuit of claim 1, comprising wherein the at least one insulating layer is the first insulating layer, and the dopant is of the same conductivity type as the body region of the vertical transistor and further portions of the semiconductor substrate.

6. The integrated circuit of claim 5, wherein the vertical transistor further comprises a spacer region of the net dopant concentration of the semiconductor substrate, the spacer region spacing the body connection region and the first source/drain region.

7. The integrated circuit of claim 1, wherein:
   the first insulating layer comprises a first dopant;
   the second insulating layer comprises a second dopant of opposite conductivity type compared to the first dopant; and
   a first doped region is formed at an interface between the semiconductor substrate and the first insulating layer, and a second doped region is formed at an interface between the semiconductor substrate and the second insulating layer, the first doped region forming a contiguous channel connection region with the first source/drain region, and the second doped region forming a body connection region between a body region of the vertical transistor and further portions of the semiconductor substrate.

8. An integrated circuit comprising:
   a vertical transistor formed in a pillar of a semiconductor substrate, comprising:
   a first source/drain region formed in a pillar of a semiconductor substrate directly adjacent to a first pillar side wall;
   a body region of a conductivity type opposite to that of the first source/drain region and formed in the pillar above the first source/drain region;
   a body connection region of the conductivity type of the body region, having a maximum dopant concentration higher than a maximum dopant concentration of the body region and extending to a substantially uniform depth from a second pillar sidewall opposite to the first pillar sidewall into the semiconductor substrate; and
   a spacer region of the net dopant concentration of the semiconductor substrate, the spacer region spacing the body connection region and the first source/drain region.

9. An integrated circuit including a memory device comprising:
   a plurality of vertical transistors, each vertical transistor comprising a buried first source/drain region formed in a pillar of a semiconductor substrate;
   a plurality of buried first conductive lines, each first conductive line being electrically coupled to a plurality of first source/drain regions through contact structures and being separated from the semiconductor substrate by a first insulating layer in a first portion;
   a plurality of second insulating layers arranged above and adjacent to the contact structures; and
   at least one doped region formed in the semiconductor substrate,
   wherein at least an individual one of the first and second insulating layers comprises a dopant, and the doped region is arranged at an interface to the at least one insulating layer, the doped region having a dopant concentration higher than a substrate dopant concentration and extending to a substantially uniform depth from the interface into the semiconductor substrate.

10. The integrated circuit of claim 9, comprising wherein the at least one insulating layer is an individual one of the second insulating layers, and the dopant is of the same conductivity type as the first source/drain region, and the doped region forms a contiguous channel connection region with a respective one of the first source/drain regions.

11. The integrated circuit of claim 10, further comprising:
   a plurality of second conductive lines, each of the second conductive lines being formed above the first conductive lines and having a lower surface disposed beneath an upper junction of the channel connection region to a body region of a respective vertical transistor.

12. The integrated circuit of claim 9, comprising wherein the at least one insulating layer is an individual one of the first insulating layers, and the dopant is of the same conductivity type as the semiconductor substrate, and the doped region forms a body connection region between a body region of a respective vertical transistor and further portions of the semiconductor substrate.

13. The integrated circuit of claim 9, wherein:
   an individual one of the first insulating layers comprises a first dopant;
   an individual one of the second insulating layers comprises a second dopant of opposite conductivity type compared to the first dopant; and
   a first doped region is formed at an interface between the semiconductor substrate and the individual one of the first insulating layers, and a second doped region is formed at an interface between the semiconductor substrate and the individual one of the second insulating layers, the first doped region forming a contiguous channel connection region with a respective one of the first source/drain regions, and the second doped region forming a body connection region between a body region of a respective vertical transistor and further portions of the semiconductor substrate.

14. The integrated circuit of claim 9, comprising wherein each pillar is adjacent to two second conductive lines configured to being held at the same potential and forming a gate electrode of the respective vertical transistor and is adjacent to two first conductive lines configured to being held at different potentials.

15. An electronic system comprising an integrated circuit including a vertical transistor formed in a pillar of a semiconductor substrate, comprising:
  a buried first conductive line separated from the semiconductor substrate by a first insulating layer in a first portion and connected to a first source/drain region of the vertical transistor through a contact structure;
  a second insulating layer arranged above and adjacent to the contact structure; and
  a doped region formed in the semiconductor substrate,
  wherein at least one of the first and second insulating layers comprises a dopant, and the doped region is arranged at an interface to the at least one insulating layer, the doped region having a dopant concentration higher than a substrate dopant concentration and extending to a substantially uniform depth from the interface into the semiconductor substrate.

* * * * *